(12) United States Patent
Balsamo et al.

(10) Patent No.: US 6,826,220 B2
(45) Date of Patent: Nov. 30, 2004

(54) SEMICONDUCTOR LASER ELEMENT HAVING A DIVERGING REGION

(75) Inventors: Stefano Balsamo, Cairo (IT); Giorgio Ghislotti, Montevecchia (IT); Salvatore Morasca, Como (IT); Fiorenzo Trezzi, Agliate (IT)

(73) Assignee: Corning O.T.I. S.R.L., Milan (IT)

( * ) Notice: Subject to any disclaimer, the term of this patent is extended or adjusted under 35 U.S.C. 154(b) by 0 days.

(21) Appl. No.: 10/168,838

(22) PCT Filed: Dec. 20, 2000

(86) PCT No.: PCT/EP00/13057
§ 371 (c)(1),
(2), (4) Date: Jun. 21, 2002

(87) PCT Pub. No.: WO01/48874
PCT Pub. Date: Jul. 5, 2001

(65) Prior Publication Data
US 2003/0031222 A1 Feb. 13, 2003

Related U.S. Application Data
(60) Provisional application No. 60/177,353, filed on Jan. 24, 2000.

(30) Foreign Application Priority Data
Dec. 27, 1999 (EP) .............................. 99126003

(51) Int. Cl.[7] .............................. H01S 3/17; G02B 6/26
(52) U.S. Cl. .......................................... 372/50; 385/43
(58) Field of Search .............................. 372/45, 46, 50, 372/64; 385/43

(56) References Cited
U.S. PATENT DOCUMENTS 4,251,780 A  2/1981  Scifres et al.

4,349,905 A  9/1982  Ackley (List continued on next page.)

FOREIGN PATENT DOCUMENTS

| GB | 2080609 | 2/1982 |
| GB | 2317744 | 4/1998 |
| JP | 61020913 | 1/1986 |
| JP | 02020089 | 1/1990 |

OTHER PUBLICATIONS

Syamsul El Yumin, Kazuhiro Komori, Shigehisa Arai, IEICE Transactions on Electronics vol. E77–C, No. 4, Apr. 1994 Tokyo, JP., pp. 624–632 Taper–Shape Dependence of Tapered–Waveguide Traveling Wave Semiconductor Laser Amplifier.

Takemasa Tamanuki, Tatsuya Sasaki and Mitsuhiro Kitamura Opto–Electronics Research Laboratories, NEC Corporation Proceedings of the International Conference on Indium Phosphide and Related Materials, US, NY IEEE, vol. Conf. 7, 1995, pp. 725–728 High Power and Narrow Lateral Far Field Divergence 1.5 um–Eye–Safe Pulse Laser Diodes with Flared Waveguide.

(List continued on next page.)

*Primary Examiner*—Don Wong
*Assistant Examiner*—Phillip Nguyen
(74) *Attorney, Agent, or Firm*—Ronald J. Paglierani

(57) ABSTRACT

A semiconductor ridge laser for coupling to a single-mode optical fiber has a ridge with a narrow parallel region, a diverging region, and then a wide parallel region that is adjacent to an output facet. A pump region for the laser may be less than the entire area of the ridge and have a "T" shape. Preferably, the ridge has a depth of about 350 to 550 nm and the narrow parallel region has a length of more than 0.4 times the overall length of the ridge. The wide parallel region at the output enables the laser to obtain low thermal resistance, which leads to a low operating temperature, a low power density in the laser cavity, and low astigmatism.

21 Claims, 12 Drawing Sheets

U.S. PATENT DOCUMENTS

| | | | |
|---|---|---|---|
| 4,689,797 A | | 8/1987 | Olshansky |
| 4,942,585 A | | 7/1990 | Ungar |
| 5,402,511 A | * | 3/1995 | Malone et al. ................. 385/43 |
| 5,793,521 A | * | 8/1998 | O'Brien et al. ............. 359/344 |
| 5,987,046 A | * | 11/1999 | Kobayashi et al. ........... 372/45 |
| 6,052,397 A | * | 4/2000 | Jeon et al. .................... 372/46 |
| 6,075,801 A | * | 6/2000 | Tamanuki et al. ............. 372/46 |
| 6,108,478 A | * | 8/2000 | Harpin et al. ............... 385/129 |
| 6,229,947 B1 | * | 5/2001 | Vawter et al. ............... 385/132 |
| 6,259,718 B1 | * | 7/2001 | Okuda .......................... 372/96 |
| 6,310,995 B1 | * | 10/2001 | Saini et al. .................... 385/28 |
| 6,324,326 B1 | * | 11/2001 | Dejneka et al. ............. 385/123 |
| 6,360,048 B1 | * | 3/2002 | Yamada ...................... 385/131 |
| 6,375,364 B1 | * | 4/2002 | Wu .............................. 385/88 |
| 6,414,976 B1 | * | 7/2002 | Hirata .......................... 372/45 |
| 6,571,039 B1 | * | 5/2003 | Al-hemyari et al. .......... 385/43 |
| 6,580,850 B1 | * | 6/2003 | Kazarinov et al. ............ 385/28 |
| 6,681,069 B2 | * | 1/2004 | Galarza et al. ............... 385/50 |

OTHER PUBLICATIONS

Sato H. et al IEEE Photonics Technology Letters, US, IEEE Inc., NY vol. 10, No. 4, Apr. 1, 1998, pp. 484–486 Improved High–Temperature Characteristics in a Thickness–Tapered 1.3 Mum Beam–Expander Integrated Ridge–Waveguide Laser.

* cited by examiner

SEMICONDUCTOR LASER ELEMENT HAVING A DIVERGING REGION

This application claims the benefit of Provisional Application No. 60/177,353, filed Jan. 24, 2000

BACKGROUND OF THE INVENTION

The present invention relates generally to semiconductor laser devices and, more particularly, to a high-power ridge laser adapted for coupling to a single-mode optical fiber without additional corrective optics.

With the growth of optical communications, semiconductor lasers have become important components in telecommunication systems. These laser devices enable a high quality of light emission, in particular single transverse mode emission, at relatively high power levels. High power single-mode semiconductor lasers can be used, in particular, as pump lasers for optical fiber amplifiers.

In a standard semiconductor laser, an active region is embedded in a p-n junction. A multilayer structure creates a high refractive index region at both sides of the active region. In such a way, light propagating parallel to the layers can be guided in the active region.

Ridge semiconductor lasers are known that have a region of increased vertical thickness compared with regions lateral to it in the laser. By changing the thickness of layers (for example by selective etching), lateral modulation of the refractive index can be obtained, in order to achieve a light-guiding section. The region with higher thickness (usually called the ridge) has a higher effective refractive index than the lateral regions. The extent of the refractive index step depends on the thickness of the ridge with respect to the lateral regions. Because the real part of the refractive index is higher at the ridge than outside it, light can be guided along the ridge. This guiding mechanism is referred to as index guiding.

As well, current may be injected through metallic contacts deposited on the p and n sides and into the active region. Since the optical gain increases as a function of the carrier concentration, gain is higher in the region beneath the contacts than in the outside region, and laser light will propagate in the high gain region. This guiding mechanism is referred to as gain guiding. In ridge lasers, both index and gain guiding are used as guiding mechanisms, the relative weight of each mechanism depending on the real refractive index change induced by the ridge and on current injection.

In stripe semiconductor lasers, only gain-guiding takes place in the light-guiding section. Stripe lasers are devices in which the injection of charge carriers across one or more semiconductor junctions results in stimulated emission. Mirrored surfaces on the device form a cavity in which the stimulated emission will produce lasing when the injected current density is above a certain threshold level.

For effective use in optical communication systems, for example as pump sources of erbium doped optical fiber amplifiers, semiconductor laser diodes should be able to be coupled efficiently to a single-mode optical fiber, which will carry the light emitted by the laser. Conventional lasers are astigmatic and require corrective optics for compensating vertical divergence of the emitted light, in order to efficiently coupling with the single-mode fiber. Moreover, high-power laser require additional corrective optics in order to achieve an efficient fiber coupling also in the transverse direction. In the following, we will refer to this additional corrective optics simply as "additional optics".

Patents and publications disclose various arrangements for gain-guiding and index-guiding in semiconductor laser elements. For example, U.S. Pat. No. 4,251,780 discloses an injection laser of the multilayer planar type having stripe offset geometry on the planar surface of the laser. The patent discloses that the offset geometry is a stripe or substrate channel that is non-orthogonal to the cleaved end facets and stabilizes the transverse mode. A parabolic-shaped or trapezoidal-shaped geometry is described for the laser stripe to enhance control of the transverse mode. In some embodiments, the stripe offset geometry is provided with two parabolic sections coupled to a central straight section.

U.S. Pat. No. 4,942,585 discloses a semiconductor laser having a pumped trapezoidal-shaped gain medium layer between a wide output facet and a narrower mirror facet. The laser provides high power by having a wide output facet so that the power density at the output facet is low enough to avoid catastrophic optical mirror damage. At the end of the gain layer opposite the output, the gain layer is parallel-edged and index-guided to ensure a single-mode output. At the output end, the gain layer diverges from the parallel-edged portion outward to the output facet. The entire diverging region of the gain layer is pumped to stimulate emission of radiation.

U.S. Pat. No. 4,349,905 discloses a stripe semiconductor laser having an active stripe region with a tapered width. The stripe laser structure has a pair of wide sections that allow a low threshold current density for lasing, a narrower section to preclude oscillation in unwanted modes, and a pair of tapered stripe sections connecting the wide sections to the narrow section. It further discloses a stripe laser structure having a single tapered section connecting a wide section with a narrow section, where the narrow section leads to the output facet. In this structure, the narrow stripe width reduces the minimum image size when a tightly focused beam is required.

U.S. Pat. No. 4,689,797 discloses a semiconductor laser having an active layer with a narrow waveguide section and an amplifier section. The narrow waveguide section provides lateral mode stability while the amplifier section provides a large reservoir of injected carriers required for high power lasing. The laser structure further includes a rear facet with a reflectivity between 90–97% near the amplifier section and a front facet with reflectivity below 10% near the waveguide section. The narrower waveguide section, therefore, leads to the output of the device.

UK Patent Application GB 2317744A discloses an incoherent array of tapered semiconductor lasers suitable for materials processing having a ridge loaded or buried laser structure that is formed on a single chip. This application discloses that the lasers forming the array have a straight region and a tapered region. The sides of the tapered section may be straight or follow a parabolic shape and be substantially parallel at the output end. A laser formed in this manner provides an output that can be focused to a small spot so that a material can be sufficiently heated to cause a chemical change, ablation or burning.

Applicant has noted that known laser designs that permit increased power output do not provide advantages in low thermal resistance, low power density in the laser cavity, and overall electrooptical performance of the device.

Moreover, Applicant has observed that conventional high-power lasers do not permit efficient coupling to a single-mode optical fiber without the need for additional optics.

SUMMARY OF THE INVENTION

Applicants have found that a high-power semiconductor laser element can desirably obtain high output power with low thermal resistance and low power density in the laser cavity with appropriate configuration of a guiding section, for example of a ridge. Moreover, Applicants have discovered that a semiconductor laser element having a guiding section with a narrow parallel region, a diverging region, and then a wide parallel region adjacent to the output facet produces these advantageous results as well as permits coupling to a single-mode optical fiber without using additional optics.

According to a first aspect, the present invention has to do with a semiconductor element for emitting single-mode high power laser light, comprising a light-guiding section of length L longitudinally extending between a rear facet and a front facet, said light-guiding section comprising:
a narrow portion adjacent to said rear facet having substantially parallel sides, of width W1 and length L1, for guiding a single mode of propagation,
a diverging portion of length L2, widening from width W1 to a width W3, for expanding adiabatically said single-mode of propagation,
The length L1 is greater than 0.4 L, and the light-guiding section comprises a wide portion adjacent to said front facet having substantially parallel sides of width W3 and length L3 greater than 20 μm, said width W3 being in a range between 5 and 20 μm.

In order to form a laser, the rear facet is high reflection coated and said front facet is low reflection coated.

Applicants have found that such a laser can achieve a high reliability under high output power conditions. This makes the laser particularly adapted for pumping optical amplifiers for submarine use, where reliability is a critical issue in view of the high cost of maintenance.

To form an optical amplifier, both said facets are anti reflection coated.

In one embodiment, the wavelength of said emitted laser light are around 980 nm. In this embodiment, W3 is preferably comprised between 5 and 11 μm; preferably W1 is comprised between 3 and 5 μm.

Advantageously, L3 is at least 0.04 L.
Preferably, L3 is at least 0.1 L.
Advantageously, L1 is lower than 0.8 L.
Advantageously, L2 is greater than 100 μm.
Preferably the diverging portion has straight sides having an angle of divergence lower than 2.5°.
According to a different embodiment the wavelength of the emitted laser light is around 1480 nm.
Typically, the semiconductor element comprises a plurality of layers in a vertical direction.
According to a preferred embodiment, a ridge is defined on at least one of the upper layers of said plurality of layers, thereby defining said light-guiding section.

The semiconductor element advantageously comprises an active layer having top and bottom surfaces; a core layer over each of the top and bottom surfaces of the active layer having refractive index n, wherein n decreases with distance from the active layer; a cladding layer over each core layer, and an upper thin layer on one of the cladding layers and a substrate layer on the other of the cladding layers.

Typically, a pump electrode is defined over the surface of the ridge. The pump electrode can be defined over the whole surface of said ridge. Alternatively, the pump electrode is T-shaped and has a width W1 over the narrow and diverging portion of the light-guiding section and a width W3 over the wide portion of the light-guiding section. According to a further alternative, the pump electrode is a stripe having width W1.

According to a second aspect, the present invention has to do with a pigtailed semiconductor element for emitting single mode high power laser light, comprising a light-guiding section of length L longitudinally extending between a rear facet and a front facet, the light-guiding section comprising a narrow portion adjacent to said rear facet having substantially parallel sides, of width W1 and length L1, for guiding a single mode of propagation, and a diverging portion of length L2, widening from width W1 to a width W3, for expanding adiabatically the single-mode of propagation.

The optical semiconductor element is coupled to a single mode fiber having a mode field diameter MFD, and the length L1 is greater than 0.4 L. The light-guiding section comprises a wide portion adjacent to the front facet having substantially parallel sides of width W3 and length L3 greater than 20 μm. The width W3 is in a range between 0.6 MFD and 1.4 MFD.

Preferably, the width W3 is in a range between 0.85 MFD and 1.15 MFD.

Preferably, the coupling with said single-mode fiber is a butt-coupling.

According to a third aspect, the present invention has to do with an optical fiber amplifier comprising a rare earth doped optical fiber, a pigtailed semiconductor element as indicated above, for providing a pump emission, and a dichroic coupler suitable for coupling the pump emission to the rare earth doped optical fiber.

It is to be understood that both the foregoing general description and the following detailed description are exemplary and explanatory only and are intended to provide further explanation of the invention as claimed. The following description, as well as the practice of the invention, set forth and suggest additional advantages and purposes of the invention.

BRIEF DESCRIPTION OF THE DRAWINGS

The accompanying drawings, which are incorporated in and constitute a part of this specification, illustrate embodiments of the invention and, together with the description, serve to explain the advantages and principles of the invention.

DETAILED DESCRIPTION OF THE PREFERRED EMBODIMENTS

Figure 1:
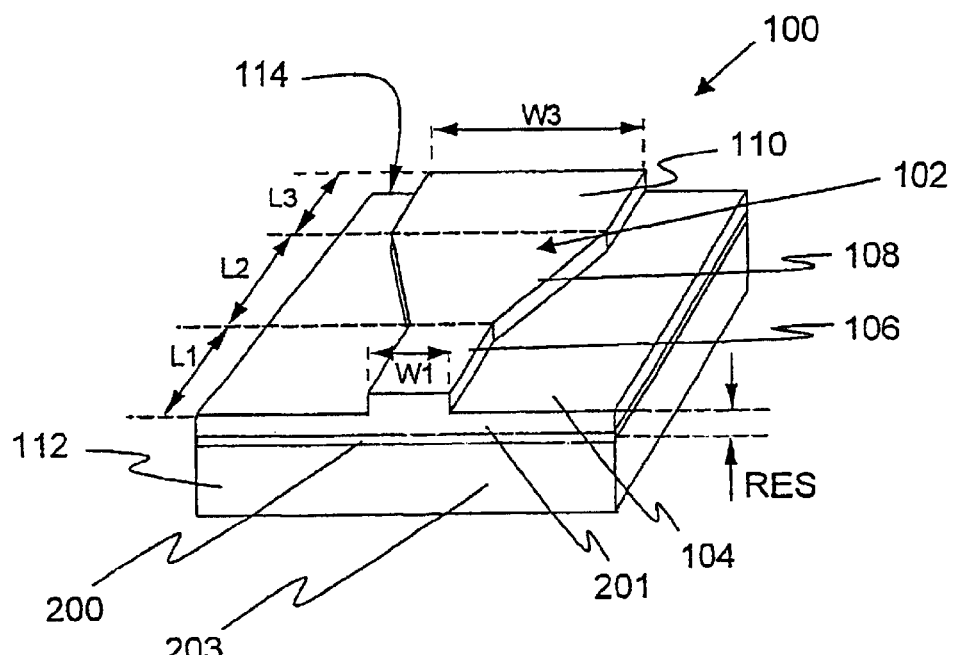
FIG. 1 is a plan view illustrating a semiconductor laser consistent with one embodiment the present invention.

Reference will now be made to various embodiments according to this invention, examples of which are shown in the accompanying drawings and will be obvious from the description of the invention. In the drawings, the same reference numbers represent the same or similar elements in the different drawings whenever possible.

FIG. 1 illustrates a plan view (not to scale) of a semiconductor laser element 100 consistent with a preferred embodiment of the present invention. In a conventional fashion, laser 100 comprises a series of layers of material. The particular preferred vertical structure for laser 100 is shown schematically in FIG. 2. Specifically, the vertical structure of laser element 100 comprises a graded index separate confinement heterostructure 200 (GRIN region), sandwiched between two $Al_xGa_{1-x}As$ cladding layers 202, 202', where x is typically lower than 0.4. In a preferred example, x=0.27. The thickness of cladding layers 202, 202' is typically about 1–2 μm.

Figure 2:
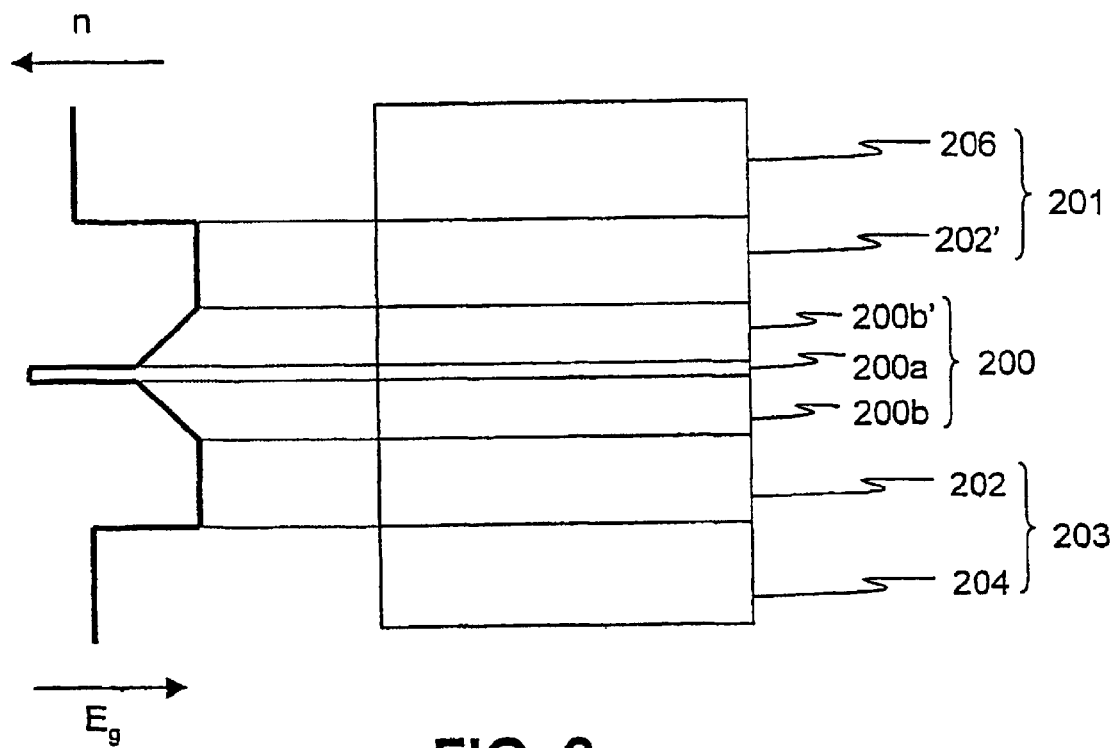
FIG. 2 is a cross-sectional view of the vertical layered structure of a semiconductor laser consistent with the present invention and a schematic illustration of the change in energy gap and refractive index of the layered vertical structure.

GRIN region 200 includes two $Al_xGa_{1-x}As$ core layers 200b and 200b'. Core layer 200b is positioned in the lower portion of GRIN region 200, and core layer 200b', is located in an upper portion. Within layers 200b and 200b', the Al level x is gradually reduced from the edge of each respective layer adjacent to layer 202 or 202' to a value of near x=0.1. FIG. 2 also schematically sketches the energy gap $E_g$ and refractive index n across the vertical layers. As shown, the energy gap decreases and the refractive index increases starting from the cladding layers 202, 202' toward the active region 200a. As it is well known in semiconductor materials an increase in the refractive index corresponds to a decrease in the energy gap and vice versa. An active region 200a is sandwiched between layers 200b and 200b'. Active region 200a is represented by an $In_yGa_{1-y}As$ quantum well, where preferably y=0.22. The thickness of the whole GRIN region 200 is typically about 0.2–2 μm, and the thickness of the sole active layer 200a is typically 6–7 nm.

The vertical structure for semiconductor laser element 100 also comprises an n-doped GaAs substrate layer 204 and a p-doped GaAs thin layer 206. The thickness of the GaAs substrate layer 204 is typically 100 μm or more. In a preferred embodiment tested by the Applicant, substrate layer 204 is 150 μm thick. Upper thin layer 206 is nearly 100 nm thick. The two GaAs layers 204, 206 realize a p-n junction. In particular, upper layer 206 is highly p-doped in order to realize an ohmic contact for pumping by current injection.

Upper layers 202' and 206 are generally combined as a group with the reference number 201 and lower layers are generally combined as a group with the reference number 203 in FIG. 2 and FIG. 1.

Although FIG. 2 illustrates one example of a vertical structure for semiconductor laser element 100, other vertical structures may be accomplished. Alternative structures may have, for example, no quantum well or more than one quantum well, different thickness of the layers, different compositions and/or semiconductor alloys for the various layers.

Referring to FIG. 1, laser element 100 includes a ridge 102 to achieve index-guiding. Ridge 102 can be created by conventional etching techniques on the upper layers 201 of the chip 100, once the vertical structure previously described in FIG. 2 has been grown. The depth of the etching defining the ridge may be measured by means of the residual RES, which is the distance between the center of the GRIN region 200 and the etched surface 104. The RES is preferably between about 350 and 550 nm.

The width of ridge 102 is not constant along the longitudinal direction of the laser 100. As shown in FIG. 1, ridge 102 may be viewed as three sections: a first region 106, a second region 108, and a third region 110. First region 106 has a length L1 with preferably substantially parallel sides and a width W1. Here and in the following of the description, "substantially parallel sides" means that the relative divergence between the sides is lower than 0.1°. Second region 108 has a length L2, and in contrast to first region 106, has diverging sides that start from a width W1 and increase until a width W3. Third region 110 has a length L3 with substantially parallel sides and a width W3. As shown in FIG. 1, W3 is greater than W1.

Figure 3:
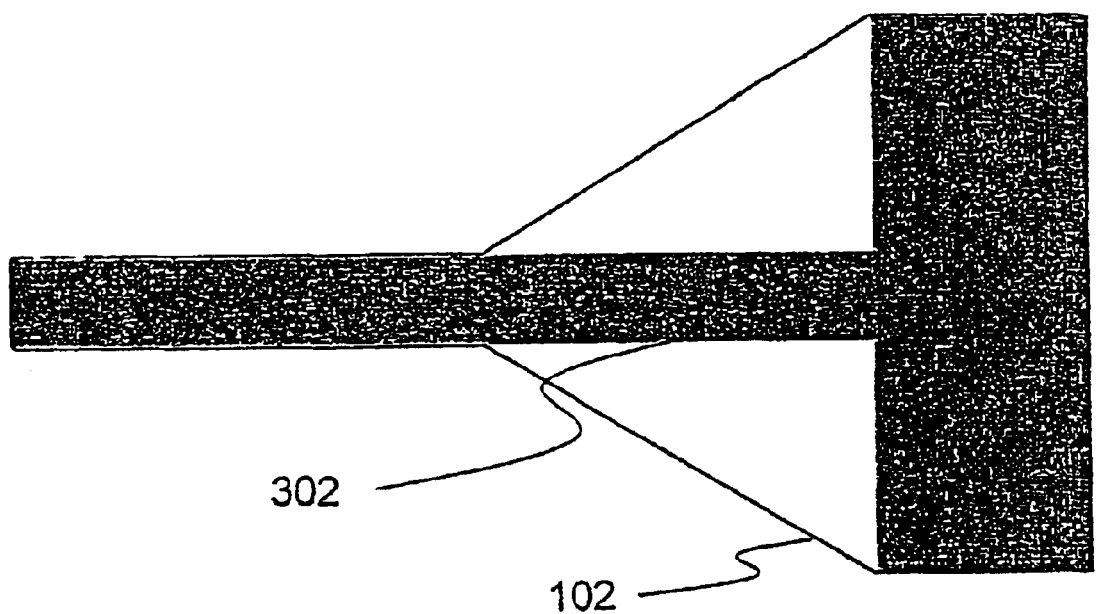
FIG. 3 is a partial top view of a ridge within the semiconductor laser of FIG. 1 having a "T" shaped contact for pumping a portion of the ridge.

As mentioned, the whole surface of the ridge 102 may be p-doped in order to realize the ohmic contact for the pumping of laser device 100. Alternatively, the contact may be performed by leaving some regions unpumped. In a preferred pumping scheme for laser element 100, doping may be performed with a "T" shaped pump electrode 11 having widths W1 and W3 where the diverging regions of ridge 102 are unpumped. FIG. 3 shows such a doping configuration with "T" shaped pump electrode 302 that pumps a portion of ridge 102. In this configuration, the entire areas of wide region 110 and narrow region 106 are pumped, while only a portion of tapered region 108 is pumped. In another alternative configuration, pumping can occur in only a stripe that is the width of narrow region 106 and that extends through tapered region 108 and wide region 110. It should be understood that various pumping configurations may be employed without departing from the scope of the present invention.

The facet 112, adjacent to narrow region 106 of ridge 102, is perpendicular to the ridge 102 and high reflection coated by deposition of dielectric films, to produce a reflectivity greater than 85%. Facet 114, adjacent to wide region 110, is perpendicular to the ridge 102 and low reflection coated by deposition of dielectric films, to produce a reflectivity below 20% and preferably below 15%, for example, around 9%. A cavity is thus defined by high-reflection facet 112 (the "rear facet") and low-reflection facet 114 (the "front facet"). By injecting current, laser light can be generated and suitably amplified in the cavity. In the vertical direction, since the refractive index is higher in GRIN region 200 (see FIG. 2), such laser light is substantially confined in GRIN region 200 itself, with maximum intensity in correspondence with active layer 200*a*.

In the lateral (transverse) direction, the light-guiding section is the result of the presence of the ridge 102, which induces a variation in the effective refractive-index profile in the lateral direction. As a result, the effective refractive-index profile is higher in a region under ridge 102 itself and lower in the remaining regions. Such effect is known as the index-guiding mechanism. Thus, in lateral direction the laser light is substantially confined in a region under ridge 102. In particular, the amount of residual RES, defining the depth of the ridge 102, is chosen in order to obtain a refractive-index step suitable for having single-mode operation of the laser in the transverse direction. Moreover, pumping by current injection results in gain-guiding. The output facet of the laser is front facet 114, adjacent to the wider region 110. The emission wavelength of the laser is preferably around 980 nm.

In alternative, by appropriately selecting its structure, e.g., the vertical structure and the active materials, according to known techniques, the invention laser can be adapted so as to achieve emission at a different wavelength, for example, around 1480 nm.

Laser 100 is pigtailed by coupling it to a single-mode fiber (not shown in FIG. 1). On the end of the fiber facing the laser, a cylindrical corrective lens is formed, for compensating divergence, only in the vertical direction. In the lateral direction, no additional optics are employed, and butt-coupling is used instead. In this arrangement, the width W3 of the third region 110 of the ridge 102 should be similar to the mode field diameter (MFD) of the single-mode fiber. Preferably, fibers that are single mode at the emission wavelength are used for coupling with the laser. In general, W3 is selected in a range between about 5 and 20 $\mu$m. Depending on the wavelength, the value of W3 is preferably chosen in a range defined by MFD±40% MFD. More preferably, W3 is chosen in a range defined by MFD±15% MFD.

For emission wavelengths around 980 nm, single mode fibers having an MFD value around 8–8.5 $\mu$m can be advantageously used. In this case the value of W3 is preferably chosen between about 5 and 11 $\mu$m, more preferably between about 7 and 9 $\mu$m.

Figure 4:
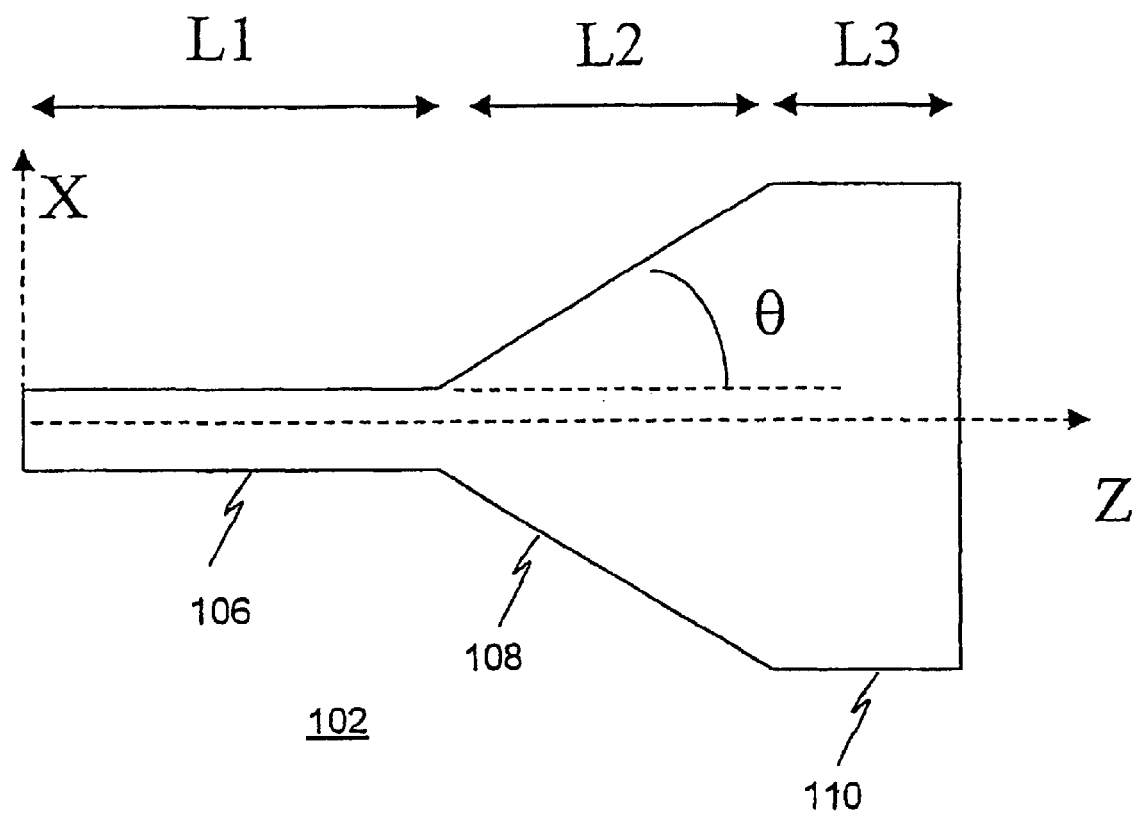
FIG. 4 is partial top view of the ridge within the semiconductor laser of FIG. 1.

FIG. 4 schematically shows the ridge 102, with geometrical parameters involved together with the longitudinal (Z) and lateral (X) directions. The three regions 106, 108, and 110 have different roles, and Applicant has found that their geometrical dimensions have to be carefully determined in order to obtain lasing at high power without degradation of the electro-optic performances of the structure, as explained below. High power is considered generally to be greater than about 100 mW.

First region 106 provides single mode selection in lateral direction during operation of the laser, thus, first region 106 is referred to as a "single-mode region." Single-mode operation of the laser is firstly controlled by the depth of the ridge 102. At high power, higher order modes can be triggered during oscillations of the laser light in the cavity, and the propagation of such higher order modes has to be avoided in order to have the maximum coupling of energy into the single-mode fiber coupled to the laser. Thus, single-mode region 106 has to be sufficiently narrow and sufficiently long in order to effectively eliminate higher order modes, that is, in order to act as an effective modal filter. On the other hand, the width of the single mode region 106 should be sufficient to provide a good ohmic contact and a reasonably low current density.

The width W1 of the single mode region 106 may be preferably chosen in a range comprised between 3 and 5 $\mu$m for the preferred emission wavelength range considered. Concerning the length L1, computer simulations performed by the Applicant show that, with L=L1+L2+L3 being the total cavity length, a length L1 of the single mode region 106 should preferably be more than about 0.4 L to obtain stable lasing action at high power. L1 below this value can result in poor mode selection.

Diverging region 108 provides a widening and amplification of the single mode propagating in the cavity, so that the power density along the cavity toward the output facet is lowered while increasing the overall optical power. The widening has to be obtained adiabatically, that is, without coupling energy into higher order modes. The adiabatic condition limits the angle of divergence θ of the diverging region 108, which depends on the lateral dimensions of the propagating mode, to very small values. Diverging region 108 can be referred to as an "adiabatic region." For the wavelength range considered, angles lower than about 2.5° are preferred. More preferably, the angle θ is lower than about 1.5°. Even more preferably, the angle θ is lower than 1°. As the skilled in the art can readily appreciate, the sides of the diverging region 108 can be accomplished in other ways, different from the straight sides shown in FIG. 4, provided that the divergence has to be performed adiabatically. The length of the diverging region 108 is preferably greater than 100 $\mu$m.

The wide parallel region 110 adjacent to the output facet of the laser provides amplification of the mode and accomplishes several advantages with respect to embodiments in which adiabatic region 108 ends at the output facet. For the wavelength range considered, W3 is preferably in a range between 5 and 11 $\mu$m. More preferably, it is in a range between 7 and 9 $\mu$m.

A first advantage is that the process of manufacturing is facilitated.

Figure 5:
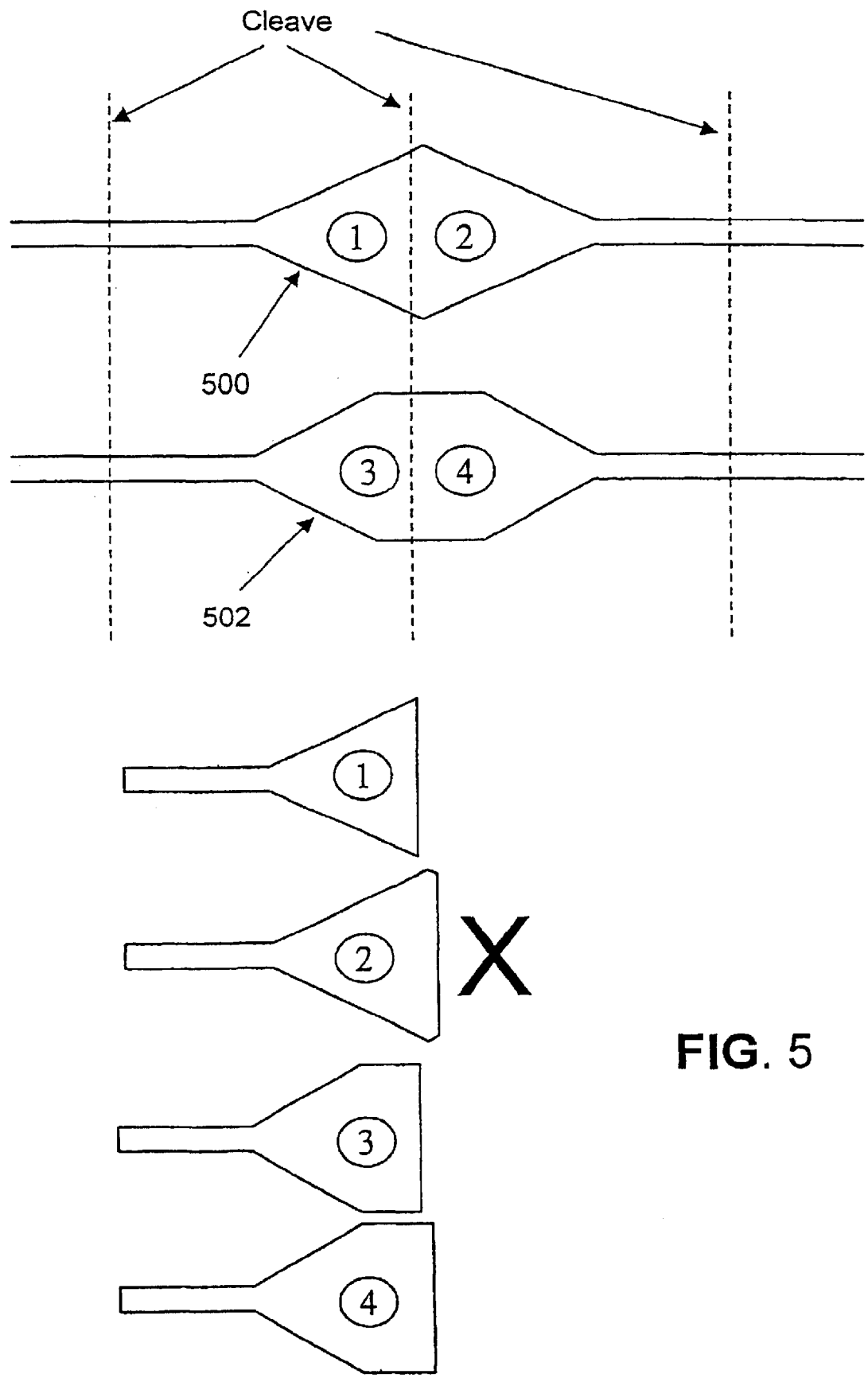
FIG. 5 is a partial top view of the ridge within the semiconductor laser of FIG. 1 undergoing cleaving during the manufacturing process.

Referring to FIG. 5, the laser can be produced starting from a long chip 500 or 502, on which at least two devices can be formed. Then, a cleaving action can be performed in order to separate the two lasers. When chip 500 does not have a wide parallel region but two flared regions that merge, then cleaving must be precise to ensure operable devices. For instance, if the cleaving for chip 500 is not precisely at the merger of the two flared regions, then section (1) may be useable, but section (2) has an unacceptable geometry much different from its mate. When long chip 502 has a wide parallel region, on the other hand, cleaving permits higher tolerances, thus incrementing the production yield. The same inaccurate cleaving for the embodiment of the invention using long chip 502 leads to slightly different devices (3) and (4), but with substantially the same characteristics.

Figure 6A:
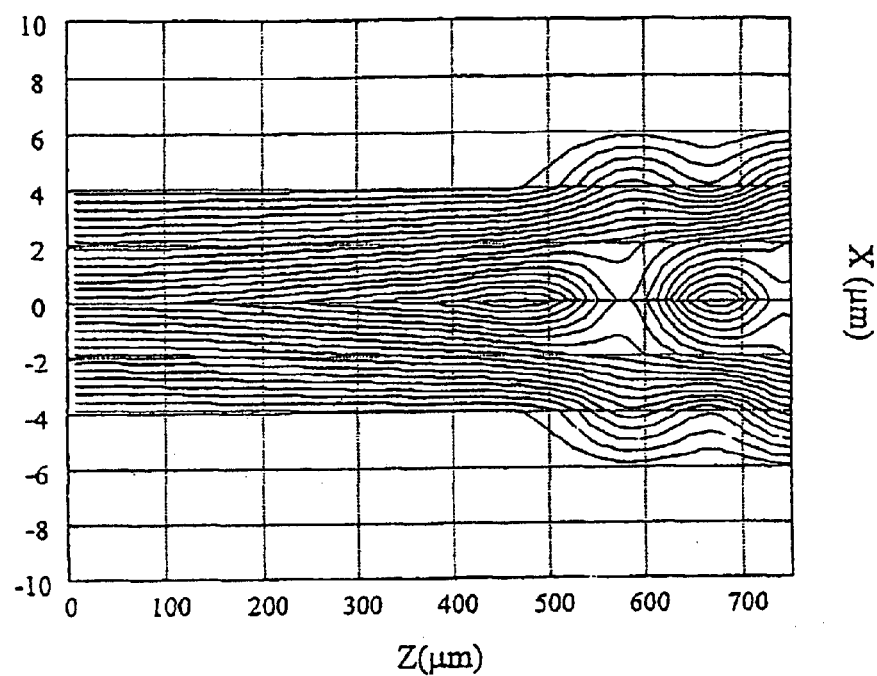
FIGS. 6A–6B are the contour plot of the electromagnetic field and the far field profile, respectively, for a ridge laser having a total length of the ridge of 750 μm, a length of an adiabatic region of the ridge of 200 μm, and a pumping current of 350 mA, when the length of the single-mode region of the ridge is 400 μm.
Figure 6B:
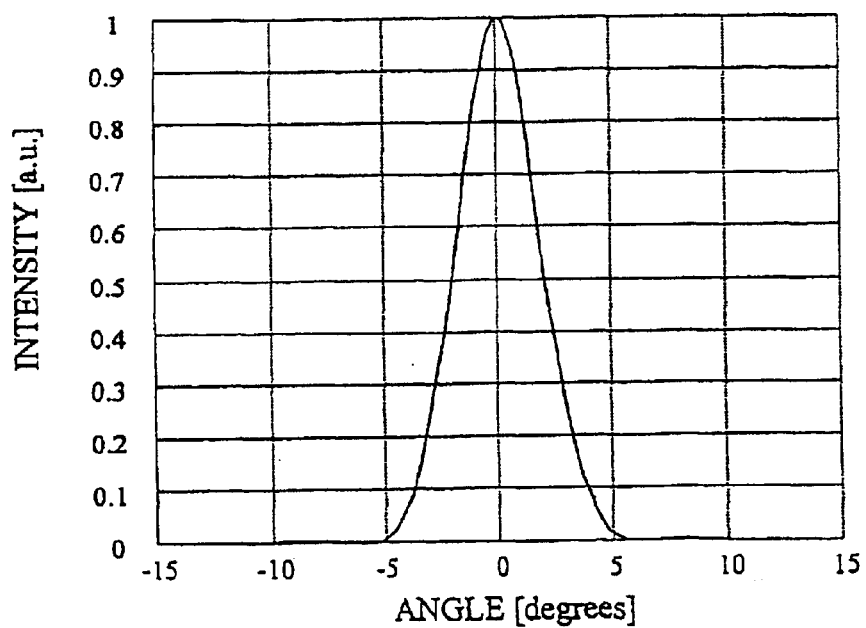
Figure 6C:
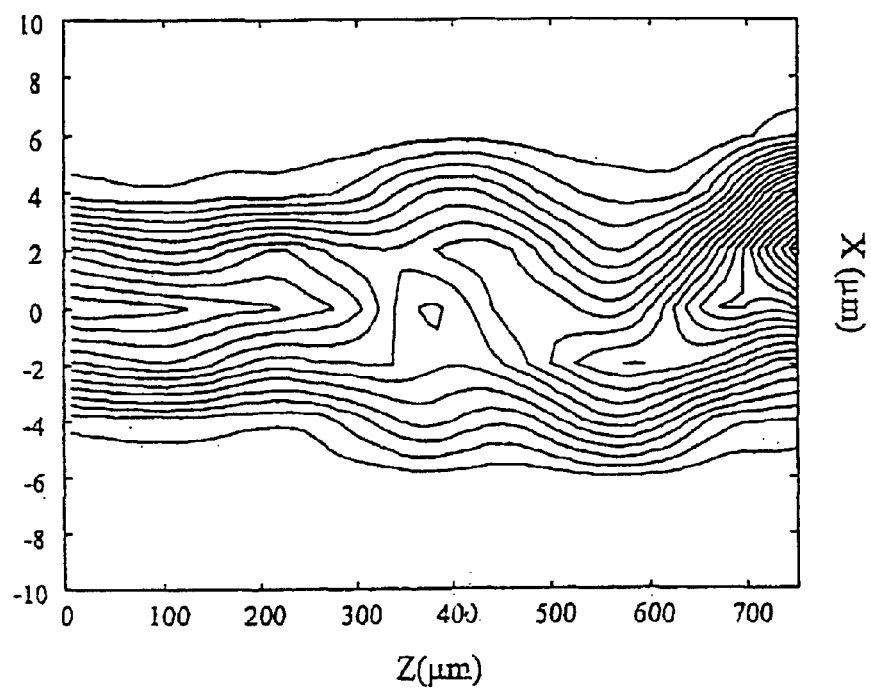
FIGS. 6C–6D are the contour plot of the electromagnetic field and the far field profile, respectively, for the ridge laser of FIGS. 6A–6B, when the length of the single-mode region of the ridge is 200 μm.
Figure 6D:
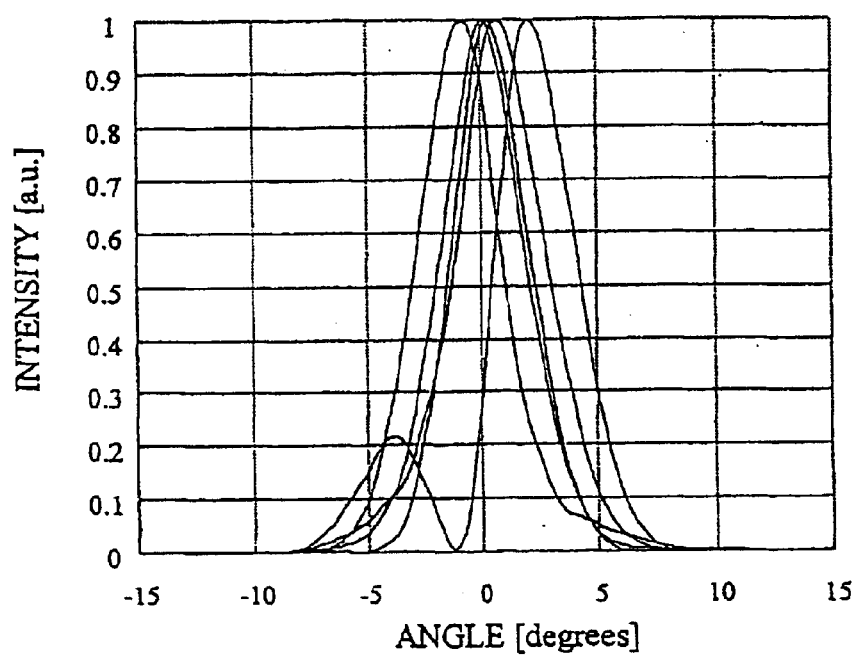

FIGS. 6A–D and 7A–D report the results of computer simulations on various configurations of ridge lasers. The results reported in FIGS. 6A–D were obtained with a total cavity length L of 750 $\mu$m, a length L2 of the diverging region 108 of 200 $\mu$m, a refractive index step in the light-guiding section of 0.003 and pumping current of 350 mA. The width W1 of the single mode region was 4.6 μm, while the maximum width of the wide region W3 was 9 μm. FIGS. 6A and 6C show the contour plot of the electromagnetic field in the plane in the GRIN region, obtained with a length L1 of the single mode region respectively of 400 μm and 200 μm. As can be seen, a length in excess of 200 μm provides a desirable dimension to obtain a stable lasing action. The same result can be seen by comparing FIGS. 6B and 6D, which plot the behavior of the far field in the lateral direction, respectively with L1=400 μm and L1=200 μm. In FIG. 6B, a stable profile can be observed, while in FIG. 6D undesirable oscillations are shown, due to poor mode selection and corresponding coupling of energy on higher order modes.

Figure 7A:
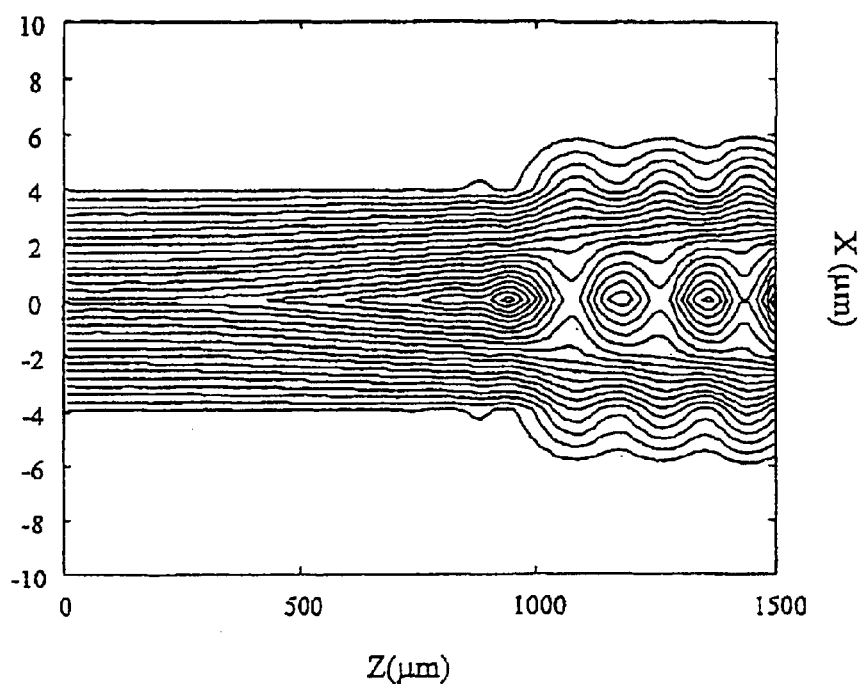
FIGS. 7A–7B are the contour plot of the electromagnetic field and the far field profile, respectively, for a ridge laser having a total length of the ridge of 1500 μm, a length of an adiabatic region of the ridge of 200 μm, and a pumping current of 650 mA, when the length of the single-mode region of the ridge is 900 μm.
Figure 7B:
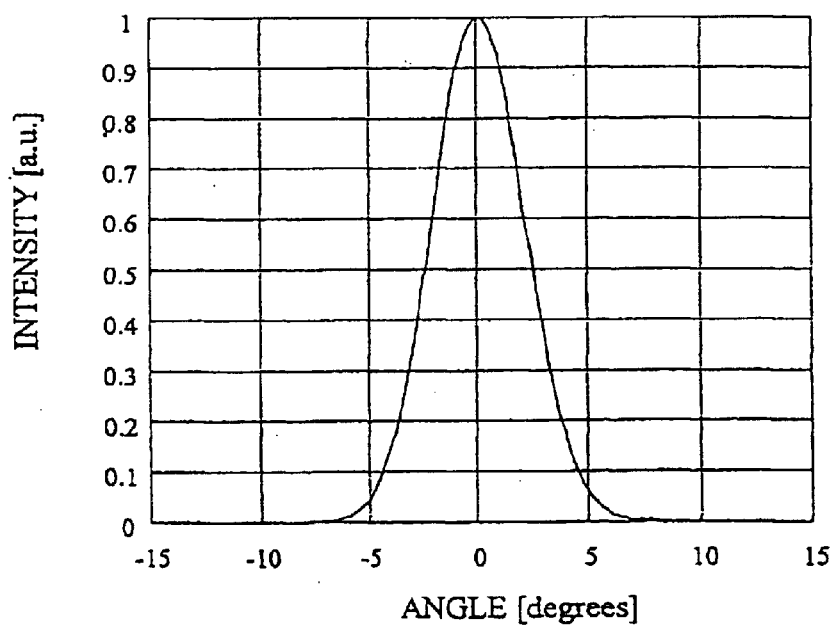
Figure 7C:
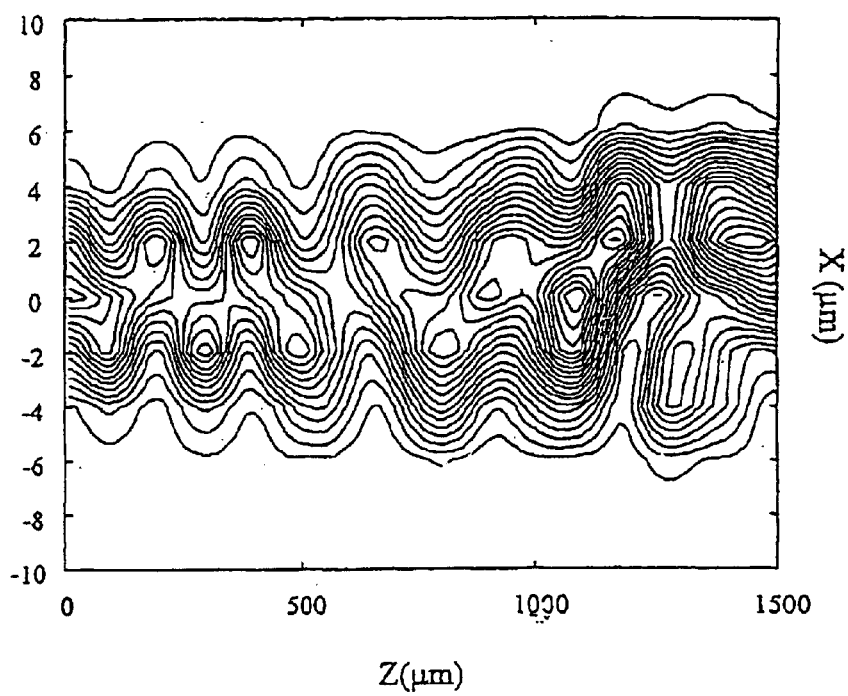
FIGS. 7C–7D are the contour plot of the electromagnetic field and the far field profile, respectively, for the ridge laser of FIGS. 7A–7B, when the length of the single-mode region of the ridge is 400 μm.
Figure 7D:
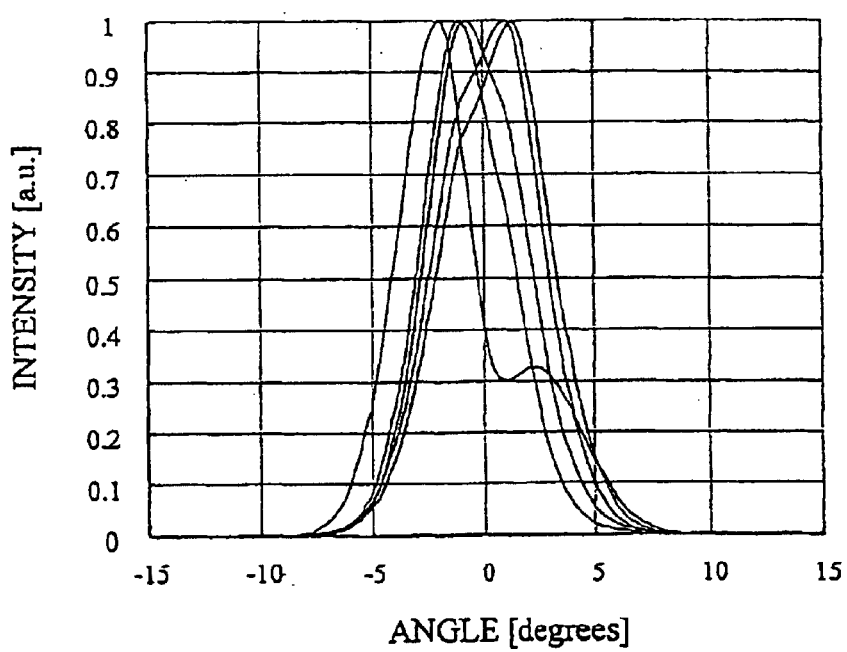

The results of FIGS. 7A–D were obtained with a total cavity length L of 1500 μm, a length of the tapered region L2 of 200 μm, a refractive index step in the light-guiding section of 0.003 and a pumping current of 650 mA. The width W1 of the single mode region was 4.6 μm, while the maximum width of the wide region W3 was 9 μm. FIGS. 7A and 7B plot the results obtained with a length L1 of the single mode region of 900 μm, respectively in the plane of the GRIN region and in the lateral direction on the output facet. As it can be seen, a very stable lasing action is obtained. FIGS. 7C and 7D plot the corresponding results obtained with a length L1 of the single mode region of 400 μm. As it can be seen, unwanted oscillations result. Preferably, to avoid high peak power densities due to the narrow width of the single mode region 21, the length L1 should be less than about 0.8 L.

As far as the electrical and thermal resistance are concerned, very low values can be achieved the longer the wide parallel region 110 is made, due to the large cross-sectional area comprising both the adiabatic region 108 and the wide parallel region 110. For fixed values of the total length of the cavity L and of the widths W1 and W3, the preferred embodiment of the invention has a larger cross-sectional area (e.g. (3) and (4) in FIG. 5) compared with a device in which the adiabatic region ends at the output facet (e.g. (1) in FIG. 5). Thus, the electrical resistance is reduced in the device of the present invention. Also, the thermal resistance is reduced in the preferred device that has a wide parallel region 110 following adiabatic region 108 in ridge 102. The thermal resistance is defined as $$R_{TH} = \frac{\Delta T}{P_{dissip}} \quad (1)$$

where ΔT is the temperature difference between the active region 200 and the substrate 204 of the device and $P_{dissip}$ is the dissipated power during operation. A lower thermal resistance leads to a lower operating temperature. Generally speaking, a lower operating temperature is advantageous, since a corresponding lower enhancement of the refractive index profile in the lateral direction induced by temperature effect can be obtained, leading to a lower probability of triggering higher order modes when high powers are involved. Moreover, a lower operating temperature results in higher reliability of the device. Applicant has found that the laser of the present invention unexpectedly enhances the beneficial effect of a lower operating temperature, due to the presence of the wide parallel region 110 adjacent to the output facet 114.

FIGS. 8 and 9 report the results of simulations carried out for three kinds of lasers, assuming different geometrical designs of the ridge: (a) a laser having a conventional structure with no diverging regions in the ridge; (b) a laser having a conventional structure with a wide region of an adiabatic region ending at the output facet; and (c) a laser according to the present invention with a wide region of an adiabatic region and a wide parallel region adjacent to the output facet. The vertical structure was the same for the three lasers, as well as the ridge depth, the output power and the device length. The width W1 of the single mode region (for laser (a) such a width corresponds to the full ridge width) was 4.6 μm. For laser (b) and (c), the maximum width of the wide region W3 was 9 μm. For laser (c), such a width corresponds to the width of wide parallel region 110 adjacent to output facet 114. Table 1 summarizes the geometrical dimensions of the various regions.

TABLE 1

| Device | L1 (μm) | L2 (μm) | L3 (μm) |
|---|---|---|---|
| (a) | 1250 | — | — |
| (b) | 650 | 600 | — |
| (c) | 650 | 200 | 400 |

As it can be seen, the same length L1 of the single-mode region was used for the lasers (b) and (c).

Figure 8A:
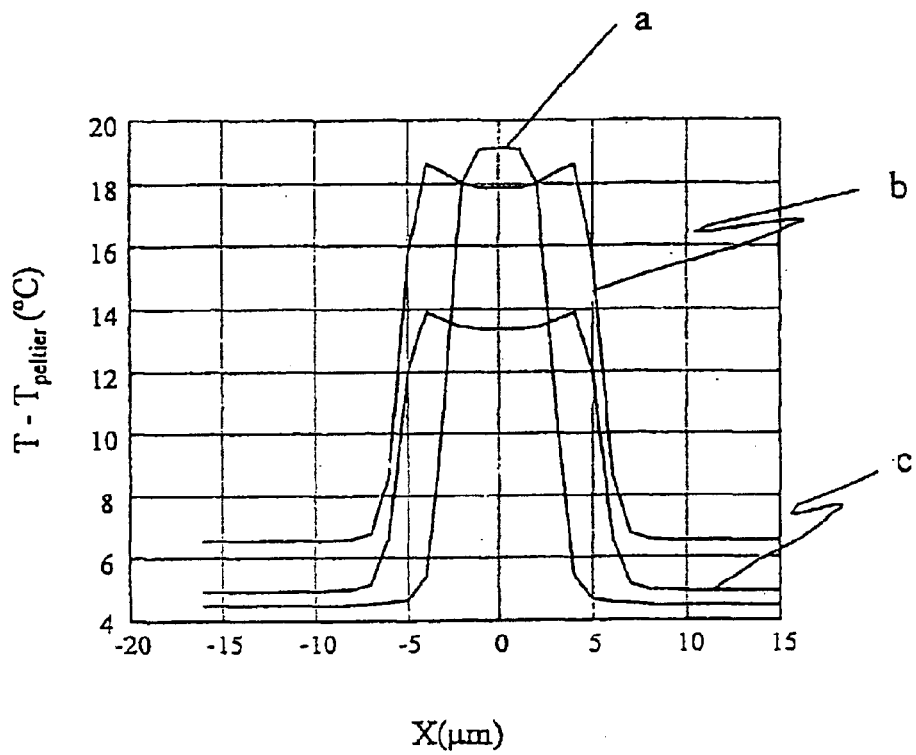
FIGS. 8A–8B are plots of the temperature profiles within the active layer in the lateral and longitudinal directions, respectively, for three representative lasers having a total ridge length of 1250 μm.
Figure 8B:
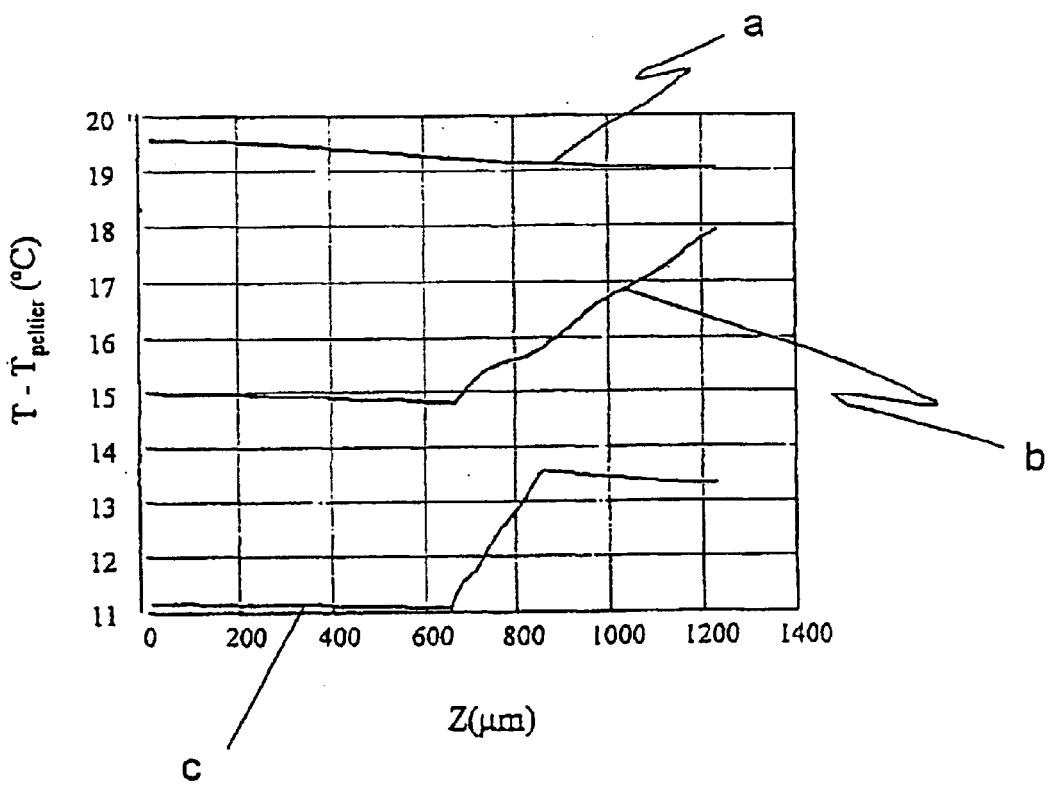

FIGS. 8A and 8B report the results for devices having a total length L=1250 μm. FIG. 8A plots the temperature profile within the active layer for the three lasers (with respect to the temperature of a Peltier cell placed below the laser itself, which corresponds to the temperature of the substrate 204) in the lateral direction X (see FIG. 4) at the output facet. FIG. 8B plots the temperature profile within the active layer in the longitudinal direction Z (see FIG. 4) along the cavity.

As it is shown in FIG. 8A, both lasers (b) and (c) have a larger profile compared to the profile of laser (a) due to the lower power density. Nevertheless, laser (b) has substantially the same temperature enhancement of laser (a), while laser (c) has a much lower peak. It should be noticed that the reduction amount is 25%. This substantial reduction of the temperature allows high power operation without excitation of higher order modes, as previously said.

As it is shown in FIG. 8B, both lasers (b) and (c) have a lower profile with respect to laser (a), but laser (c) has the lowest temperature along the whole cavity, with a significant reduction. The temperature along the cavity in the Z direction is particularly lower in the region adjacent to the output facet.

Figure 9A:
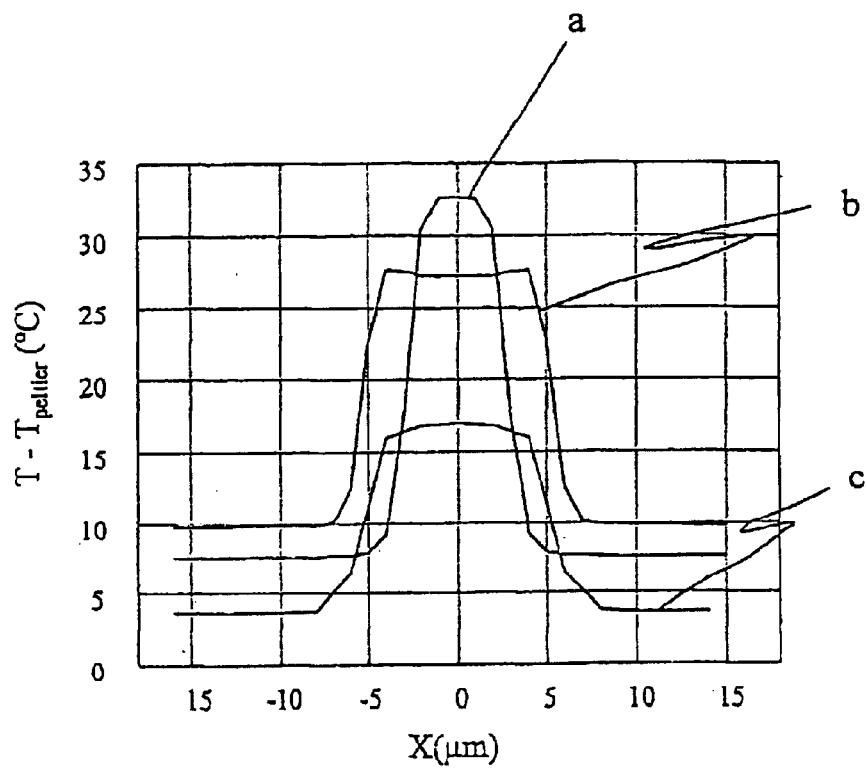
FIGS. 9A–9B are plots of the temperature profiles within the active layer in the lateral and longitudinal directions, respectively, for three representative lasers having a total ridge length of 1500 μm.
Figure 9B:
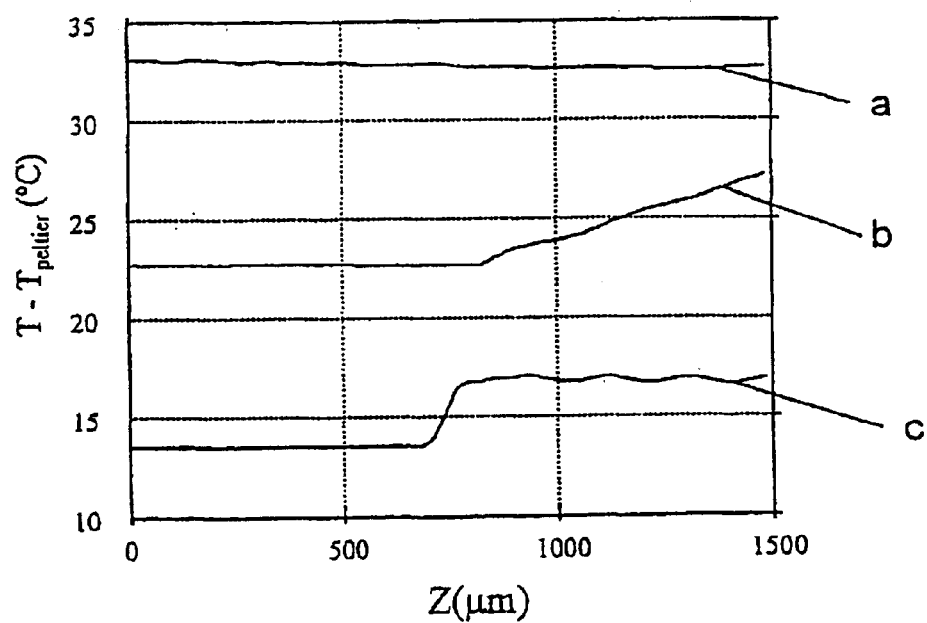

Even more enhanced results are shown in FIGS. 9A–9B, which are plots of the corresponding data of FIGS. 8A–8B, obtained with a total length of the device of 1500 μm. Table 2 summarizes the geometrical dimensions of the various regions.

TABLE 2

| Device | L1 (μm) | L2 (μm) | L3 (μm) |
|---|---|---|---|
| (a) | 1500 | — | — |
| (b) | 650 | 850 | — |
| (c) | 650 | 200 | 650 |

Figure 10A:
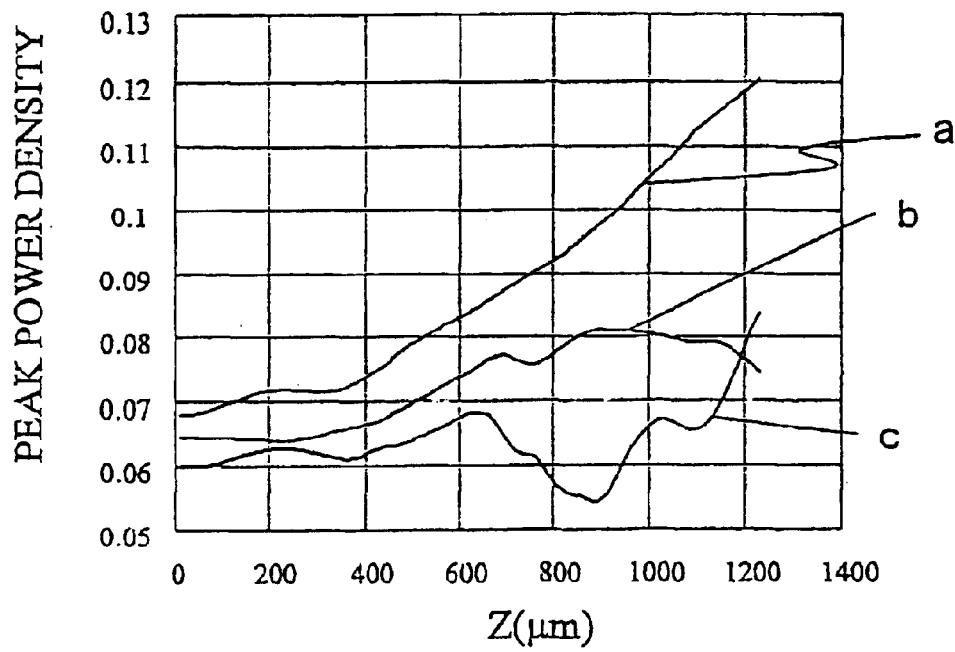
FIGS. 10A–10B are plots of the peak power profile longitudinally along the cavity for the three representative lasers of FIGS. 8A–8B and FIGS. 9A–9B, respectively.
Figure 10B:
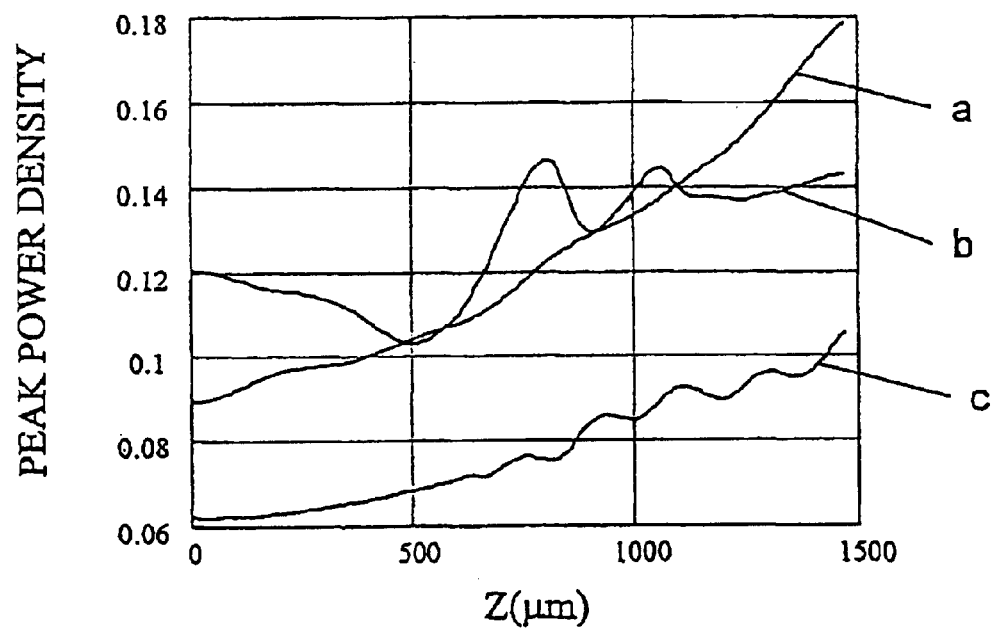

As can be seen by a comparison between Table 1 and Table 2, the only difference in laser (c) is in the length L3 of wide parallel region 110, which is 650 μm rather than 400 μm. As shown by FIGS. 9A–9B, the reduction of the temperature, both in the lateral and longitudinal directions, is even more significant with a longer L3. FIG. 10A and FIG. 10B are the plots of the peak power profile along the cavity for the same lasers of FIGS. 9A and 9B. The advantageous effect of wide parallel region 110 adjacent to the output facet for sample laser (c) is evident for obtaining a lower peak power density.

It should be noticed that the advantageous results on the temperature profile and on the peak power profile are due to the appropriate choice of putting the wide parallel region adjacent to the output facet of the laser, that is in a region where the power is high. Such results are significant for a high-power single-mode laser having a spot size with a small lateral dimension. This type of laser permits efficient connection by butt-coupling in lateral direction to a single mode fiber. For lasers with a larger lateral dimension (20 $\mu$m or more in the emission wavelength range considered), the effects on the temperature profile and on the peak power profile are mitigated by the fact that the power density is lower, due to the larger spot size area.

Applicant has also found that the length L3 of the wide parallel region adjacent to the output facet should preferably be at least 20 $\mu$m for an appreciable effect from the present invention. Advantageously, the length L3 of the wide parallel region should be at least 0.04 L. More preferably, the length L3 of the wide parallel region should be at least 0.1 L. Even more preferably, the length L3 of the wide parallel region should be at least 0.2 L.

Reliability data collected on more than 300 flared devices according to the invention, having a total length of 750 $\mu$m, tested at different conditions (output power ranging from 200 mW to 350 mW, case temperature from 25° C. to 70° C., emission wavelength about 980 nm), indicated that a flared structure according to the invention allows to achieve a failure rate (in FIT units) which is more than 40% lower than the value obtained with a conventional laser having the same cavity length L and no flared structure, operating at the same conditions (output power, case temperature). This result is particularly significant for applications for which reliability is a key issue of the component (e.g. submarine applications).

Other advantages of the wide parallel region adjacent to the output facet are related to the optical characteristics of the beam emitted by the output facet of the laser.

Figure 11:
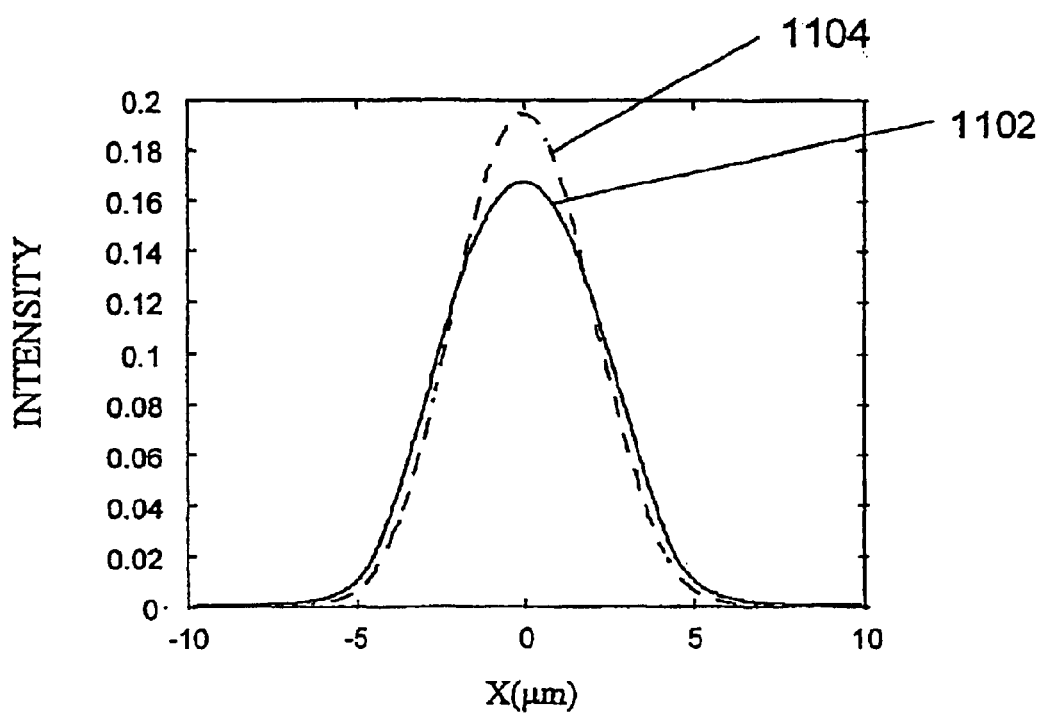
FIG. 11 is a plot of the beam intensity profile at the output facet for a laser consistent with the present invention compared to a conventional laser.

FIG. 11 shows a plot of the beam intensity profile at the output facet. In particular, the continuous line 1102 represents the beam intensity profile of a laser according to the present invention with L1=400 $\mu$m, L2=200 $\mu$m, L3=150 $\mu$m. The dashed line 1104 represents the beam intensity profile of a laser having a diverging adiabatic section that continues until the output facet (such as laser (b) above), with L1=400 $\mu$m and L2=350 $\mu$m. Both lasers have W1=4.6 $\mu$m and W3=9 $\mu$m. As shown in FIG. 11, the beam intensity profile 1102 is lower and wider for the laser according to the present invention. This leads to a respective lowering of the power density at the output facet, which is advantageous for avoiding catastrophic optical mirror damage (COMD) when high powers are involved.

Figure 12:
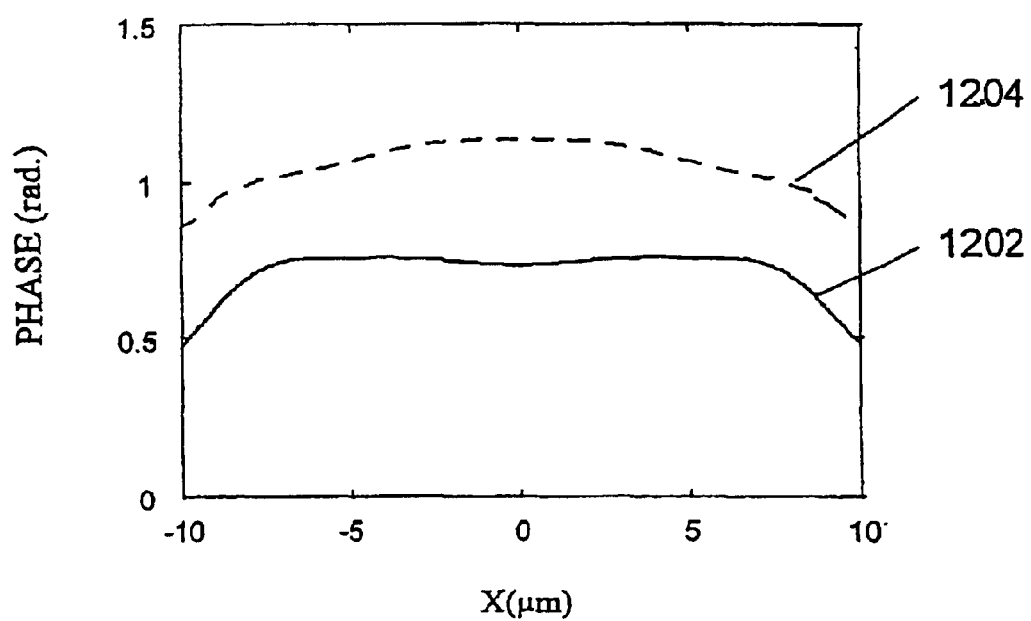
FIG. 12 is a plot of the phase profile of the beam at the output facet for a laser consistent with the present invention compared to a conventional laser.

FIG. 12 is a plot of the phase profile of the beam at the output facet of the lasers discussed for FIG. 11. As it is evident, the phase profile 1202 of the beam for the laser of the invention (continuous line) is flattened with respect to the phase profile 1204 (dashed line) for the conventional laser having a diverging region but no wide parallel region 110. In other words, the laser according to the invention is less astigmatic. This aspect is significant, since a less astigmatic beam allows a more efficient coupling of the power into a fiber, which eliminates the need for additional optics at the coupling. Further, there is an advantageous effect in the cavity, since the fraction of laser light that is reflected back by the low reflective facet in the cavity has a wave front that is flat, resulting in a very quick coupling in the cavity itself. On the other hand, an astigmatic beam leads to a divergent wave front after back reflection on the low reflective facet, which is less efficient in the coupling within the cavity, resulting in a slower phase stabilization of the beam within the cavity itself.

In the following table 3, the geometrical dimensions of advantageous exemplary structures of the invention laser emitting a wavelength around 980 nm are reported. Such lasers can couple in a fiber a power significantly higher than 150 mW.

TABLE 3

| L ($\mu$m) | L1 ($\mu$m) | L2 ($\mu$m) | L3 ($\mu$m) |
| --- | --- | --- | --- |
| 2000 | 900 | 1000 | 100 |
| 1500 | 800 | 600 | 100 |

A semiconductor laser element as herein described can be typically used as a pump laser for erbium doped optical fiber amplifiers or lasers. By following the teaching of the present description and by selecting the vertical structure and active materials according to known techniques the skilled in the art can achieve high power laser emission at other specific wavelengths, to provide a pump source for active fibers doped with other rare earth elements. The described laser allows to improve existing optical fiber amplifiers in that it allows to increase the amplifier gain and/or its output power which allows, among others, to increase the number of channels that can be amplified. Moreover, the invention laser has a high reliability and this makes the laser particularly advantageous for use in pumping submarine optical amplifiers.

As known to the skilled in the art, an optical amplifier typically includes one or more pump lasers and one or more erbium doped active fibers or, in general, rare earth doped active fibers. The pump laser or lasers are coupled to the active fiber or fibers by one or more dichroic couplers, e.g., fused fiber couplers or microoptics couplers. An optical amplifier for use in a submarine telecommunication system is typically enclosed in a tight, water-proof container.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. For example, a stripe laser using the gain guiding mechanism may be accomplished having the geometrical structure of the guiding section according to the above description. As another example, a semiconductor amplifier can be realized with a geometrical structure as above described, by providing the facets with antireflection (AR) coatings. In the case of an amplifier, both facet are preferably pigtailed with optical fibers. Preferably, oblique facets (i.e., not perpendicular to the ridge) may be further adopted to reduce backreflections.

It is intended that the specification and examples be considered as exemplary only, with a true scope of the invention being indicated by the following claims.

What is claimed is:

1. A semiconductor laser element for emitting single-mode high power laser light, comprising a light-guiding section of length L longitudinally extending between a rear facet and a front facet, said light-guiding section comprising: a narrow portion adjacent to said rear facet having substantially parallel sides, of width W1 and length L1, for guiding a single mode of propagation, a diverging portion of length L2, widening from width W1 to a width W3, for expanding adiabatically said single-mode of propagation, characterized in that: said length L1 is greater than 0.4 L, said light-guiding section comprises a wide portion adjacent to said front facet having substantially parallel sides of width W3 and length L3 greater than 20 μm, said width W3 being in a range between 5 and 20 μm.

2. A semiconductor element as in claim 1, characterized in that said rear facet is high reflection coated and said front facet is low reflection coated.

3. A semiconductor element as in claim 1, characterized in that both said facets are anti reflection coated.

4. A semiconductor element as in claim 1, characterized in that the wavelength of said emitted laser light is around 980 nm.

5. A semiconductor element as in claim 4, characterized in that W3 is comprised between 5 and 11 μm.

6. A semiconductor element as in claim 4, characterized in that W1 is comprised between 3 and 5 μm.

7. A semiconductor element as in claim 1, characterized in that L3 is at least 0.04 L.

8. A semiconductor element as in claim 7, characterized in that L3 is at least 0.1 L.

9. A semiconductor element as in claim 1, characterized in that L1 is lower than 0.8 L.

10. A semiconductor element an in claim 9, characterized in that L2 is greater than 100 μm.

11. A semiconductor element as in claim 1, characterized in that said diverging portion has straight sides having an angle of divergence lower than 2.5°.

12. A semiconductor element as in claim 1, characterized in that the wavelength of said emitted laser light is around 1480 nm.

13. A semiconductor element as in claim 1, characterized in that it comprises an active layer having top and bottom surfaces; an upper core layer over the top surface of the active layer and a lower core layer below the bottom surface of the active layer, both the upper core layer and the lower core layer having refractive index n, wherein n decreases with distance from the active layer; an upper cladding layer over the upper core layer; a lower cladding layer below the lower core layer; a thin layer on the outer surface of one of the cladding layers; and a substrate layer on the outer surface of the other of the cladding layers.

14. A semiconductor element as in claim 13, characterized in that a ridge is defined on at least one of the thin layer or its adjacent cladding layer, thereby defining said light-guiding section.

15. A semiconductor element as in claim 14, characterized in that it comprises a pump electrode defined over the surface of said ridge.

16. A semiconductor element as in claim 15, characterized in that said pump electrode is defined over the whole surface of said ridge.

17. A semiconductor element as in claim 15, characterized in that said pump electrode is T-shaped and has a width W1 over the narrow and diverging portion of the light-guiding section and a width W3 over the wide portion of the light-guiding section.

18. A pigtailed semiconductor element for emitting single mode high power laser light, comprising a light-guiding section of length L longitudinally extending between a rear facet and a front facet, said light-guiding section comprising: a narrow portion adjacent to said rear facet having substantially parallel sides, of width W1 and length L1, for guiding a single mode of propagation, a diverging portion of length L2, widening from width W1 to a width W3, for expanding adiabatically said single-mode of propagation, characterized in that said optical semiconductor element is coupled to a single mode fiber having a mode field diameter MFD, said length L1 is greater than 0.4 L, and said light-guiding section comprises a wide portion adjacent to said front facet having substantially parallel sides of width W3 and length L3 greater than 20 μm, said width W3 being in a range between 0.6 MED and 1.4 MED.

19. A pigtailed semiconductor element as in claim 18, characterized in that the coupling with said single-mode fiber is a butt-coupling.

20. An optical fiber amplifier comprising:
(a) a rare earth doped optical fiber;
(b) a pigtailed semiconductor element for providing a pump emission, comprising:
a light-guiding section of length L longitudinally extending between a rear facet and a front facet, said light-guiding section including (i) a narrow portion adjacent to said rear facet having substantially parallel sides, of width W1 and length L1, for guiding a single mode of propagation and (ii) a diverging portion of length L2, widening from width W1 to a width W3, for expanding adiabatically said single mode of propagation, characterized in that said semiconductor element is coupled to a single mode fiber having a mode field diameter MFD, said length L1 is greater than 0.4 L, and said light-guiding section comprises a wide portion adjacent to said front facet having substantially parallel sides of width W3 and length L3 greater than 20 μm, said width W3 being in a range between 0.6 MFD and 1.4 MFD; and
(c) a dichroic coupler suitable for coupling the pump emission to the rare earth doped optical fiber.

21. An optical fiber amplifier as in claim 20, characterized in that it further comprises a water-proof container, said rare earth doped optical fiber, pigtailed semiconductor element and dichroic coupler being enclosed in said container.

* * * * *